(12) United States Patent
Caswell (10) Patent No.: US 11,063,166 B2
(45) Date of Patent: Jul. 13, 2021

(54) SYSTEM AND METHOD FOR SHINGLING WAFER STRIPS CONNECTED IN PARALLEL (71) Applicant: SUNPOWER CORPORATION, San Jose, CA (US)

(72) Inventor: Nathaniel Caswell, Sunnyvale, CA (US)

(73) Assignee: SUNPOWER CORPORATION, San Jose, CA (US)

(*) Notice: Subject to any disclaimer, the term of this patent is extended or adjusted under 35 U.S.C. 154(b) by 292 days.

(21) Appl. No.: 15/725,725

(22) Filed: Oct. 5, 2017

(65) Prior Publication Data

US 2019/0109251 A1 Apr. 11, 2019

(51) Int. Cl.
H01L 31/05 (2014.01)
H01L 31/0465 (2014.01)
H01L 31/042 (2014.01)
H01L 31/068 (2012.01)

(52) U.S. Cl.
CPC ........ *H01L 31/0508* (2013.01); *H01L 31/042* (2013.01); *H01L 31/0465* (2014.12); *H01L 31/068* (2013.01)

(58) Field of Classification Search
CPC ............... H01L 31/042; H01L 31/0465; H01L 31/0508; H01L 31/068
See application file for complete search history.

(56) References Cited

U.S. PATENT DOCUMENTS

2005/0126619 A1* 6/2005 Abe ................ H01L 31/035281
                                                136/244
2015/0349161 A1* 12/2015 Morad .................... H01L 31/05
                                                438/67
2018/0183382 A1* 6/2018 Hall ........................ H02S 20/25
2019/0013428 A1* 1/2019 Shi ........................ H01L 31/042

* cited by examiner

*Primary Examiner* — Mayla Gonzalez Ramos
(74) *Attorney, Agent, or Firm* — Oblon, McClelland, Maier & Neustadt, L.L.P.

(57) ABSTRACT

A solar device includes a first string of first solar wafers, wherein a plurality of the first solar wafers each overlap with at least one vertically adjacent solar wafer from the first string. Additionally, the solar device includes a second string of second solar wafers, wherein a plurality of the second solar wafers each overlap with at least one vertically adjacent solar wafer from the second string, wherein a plurality of the first solar wafers overlap with one or more of the plurality of second solar wafers to electrically connect horizontally adjacent solar wafers in parallel.

20 Claims, 6 Drawing Sheets

SYSTEM AND METHOD FOR SHINGLING WAFER STRIPS CONNECTED IN PARALLEL

STATEMENT REGARDING FEDERALLY SPONSORED RESEARCH OR DEVELOPMENT

This invention was made with government support under DE-EE0007190 awarded by The U.S. Department of Energy. The government has certain rights in the invention.

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Photovoltaic (PV) cells, commonly known as solar cells, are well-known devices for converting solar radiation into electrical energy. PV cells can be assembled into PV modules (also referred to as solar modules), which may be used to convert sunlight into electricity. A solar energy system typically includes multiple PV modules, one or more inverters, and interconnection wiring. The PV module can include a frame, which can be mounted on top of a building, and the other components can be located on the outside or inside of the building to interface with an electric system.

SUMMARY

The foregoing paragraphs have been provided by way of general introduction, and are not intended to limit the scope of the following claims. The described embodiments, together with further advantages, will be best understood by reference to the following detailed description taken in conjunction with the accompanying drawings.

According to embodiments of the disclosed subject matter, a solar panel includes a first string of first solar wafers, wherein a plurality of the first solar wafers each overlap with at least one vertically adjacent solar wafer from the first string. Additionally, the solar panel includes a second string of second solar wafers, wherein a plurality of the second solar wafers each overlap with at least one vertically adjacent solar wafer from the second string, wherein a plurality of the first solar wafers overlap with one or more of the plurality of second solar wafers to electrically connect horizontally adjacent solar wafers in parallel.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Referring now to the drawings, wherein like reference numerals designate identical or corresponding parts throughout the several views.

Figure 1:
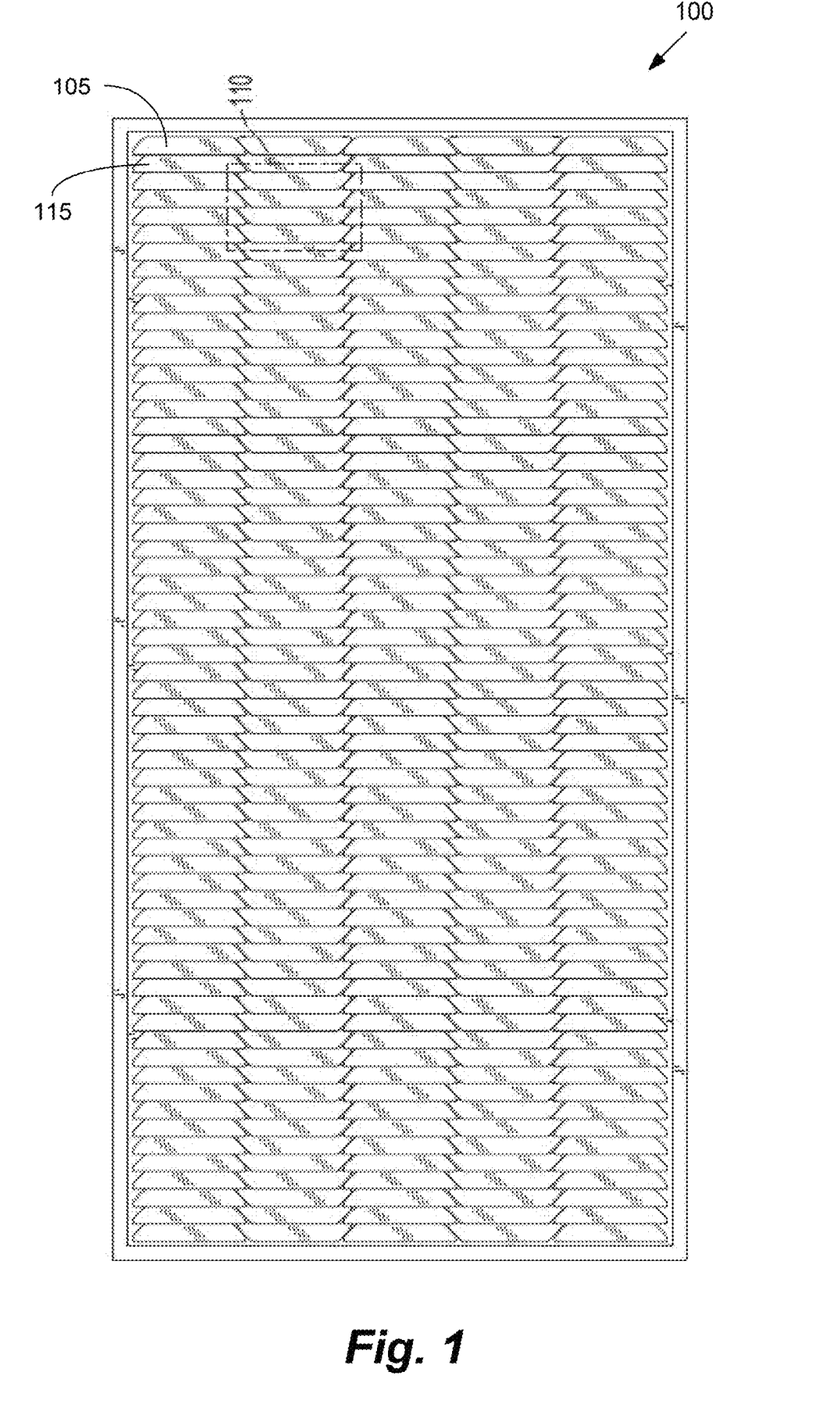
FIG. 1 depicts an exemplary overview of a solar panel according to one or more aspects of the disclosed subject matter.

FIG. 1 depicts an exemplary overview of a system of wafers (e.g., monocrystalline silicon wafers) making up a solar device 100 according to one or more aspects of the disclosed subject matter. For example, the solar device 100 can be a solar panel or a portion of solar panel, and/or the solar device 100 can be independent of a solar panel (e.g., does not imply structures like a frame attached to the solar device). The solar device 100 can include a predetermined number of solar wafers 105. The solar wafers 105 may be referred to as solar cells, wafers, solar wafers, and the like. The solar wafers can be arranged in columns, wherein each column corresponds to a string of series-connected solar wafers arranged in a shingled manner with the ends of vertically adjacent solar wafers overlapping and electrically connected. Each solar wafer can include a semiconductor diode structure and electrical contacts to the semiconductor diode structure by which electric current generated in a solar wafer when it is illuminated by light may be provided to an external load, for example. Each solar wafer (e.g., solar wafer 105) can include chamfered edges. For example, each solar wafer can be an end strip from chamfered monocrystalline silicon wafers. The chamfered edges can allow for a unique shingling technique that can increase active area, for example, while providing fully parallel connections for all strips in all strings, thereby significantly increasing robustness of the solar device 100. For example, shading, dead cells, bad contacts, cracks, chips, and the like can be less detrimental due to the parallel nature of the electrical connection.

For reference, solar cell 105 can be in a first row and a first column, such that a second column is adjacent to the right of the first column, a third column is adjacent to the right of the second column, and so on. Similarly, the solar cell 105 can be in a first row, such that a second row (e.g., the row including solar cell 115) is below the first row, a third row is below the second row, and so on. In an embodiment, the solar device 100 can include five columns and sixty-three rows. However, it should be appreciated that the solar panel can include any number of solar wafers in any number of columns and/or rows.

In an embodiment, the chamfered edge strips (e.g., solar wafer 105) can be connected as shingled strings, and the shingled strings can further be shingled onto each other. For example, columns one, three, and five can be "A" strings, and columns two, four, and six can be "B" strings. Each "A" string and "B" string can include a predetermined number of solar wafers (e.g., solar wafer 105) connected in series. Each solar wafer in an "A" string includes a first side having chamfered edges and a second side including contact pads, wherein the second side is opposite the first side. Further, each solar wafer in an "A" string has the same first predetermined orientation such that the chamfered edges of each solar wafer in the "A" string are facing the same direction. Additionally, each solar wafer in a "B" string has the same second predetermined orientation, wherein the second predetermined orientation is inverted relative to the first predetermined orientation. In other words, the first side (e.g., chamfered edge side) of each solar wafer in a "B" string is facing an opposite direction relative to the "A" string, while each solar wafer in the "B" string is positioned in the second predetermined orientation. A front face of each "A" string solar wafer and a back face of each "B" string solar wafer can include contact pads such that one or more "B" strings can overlap each "A" string such that each horizontally adjacent row of solar wafers can be connected in parallel. The solar wafer in the "A" string can be connected to the one or more adjacent "B" strings via "B" string solar wafers in the row below the row in which the "A" string solar wafer is position. As a result, the first row and the last row are not connected in parallel. However, the first row and the last row may include a ribbon to provide an electrical connection, for example.

In other words, each solar wafer (e.g., solar wafer 105) can be connected to at least one other solar wafer in the solar panel, wherein each connection can be made via a shingling technique such that each solar wafer overlaps (or is overlapped by) at least one other solar wafer. For example, the solar wafer 105 can overlap the solar wafer in the first column and the second row, as well as a corner of the solar wafer in the second column and second row. The solar wafers overlapping in each column (e.g., all vertically adjacent solar wafers) can be electrically connected in series (e.g., via contact pads). Additionally, all horizontally adjacent solar wafers can be electrically connected in parallel. Further, the first row of the solar panel can be negatively charged, while the last row of the solar device 100 can be positively charged. The electrical connection of each solar wafer to any adjacent solar wafer is further described in FIG. 4.

Figure 2A:
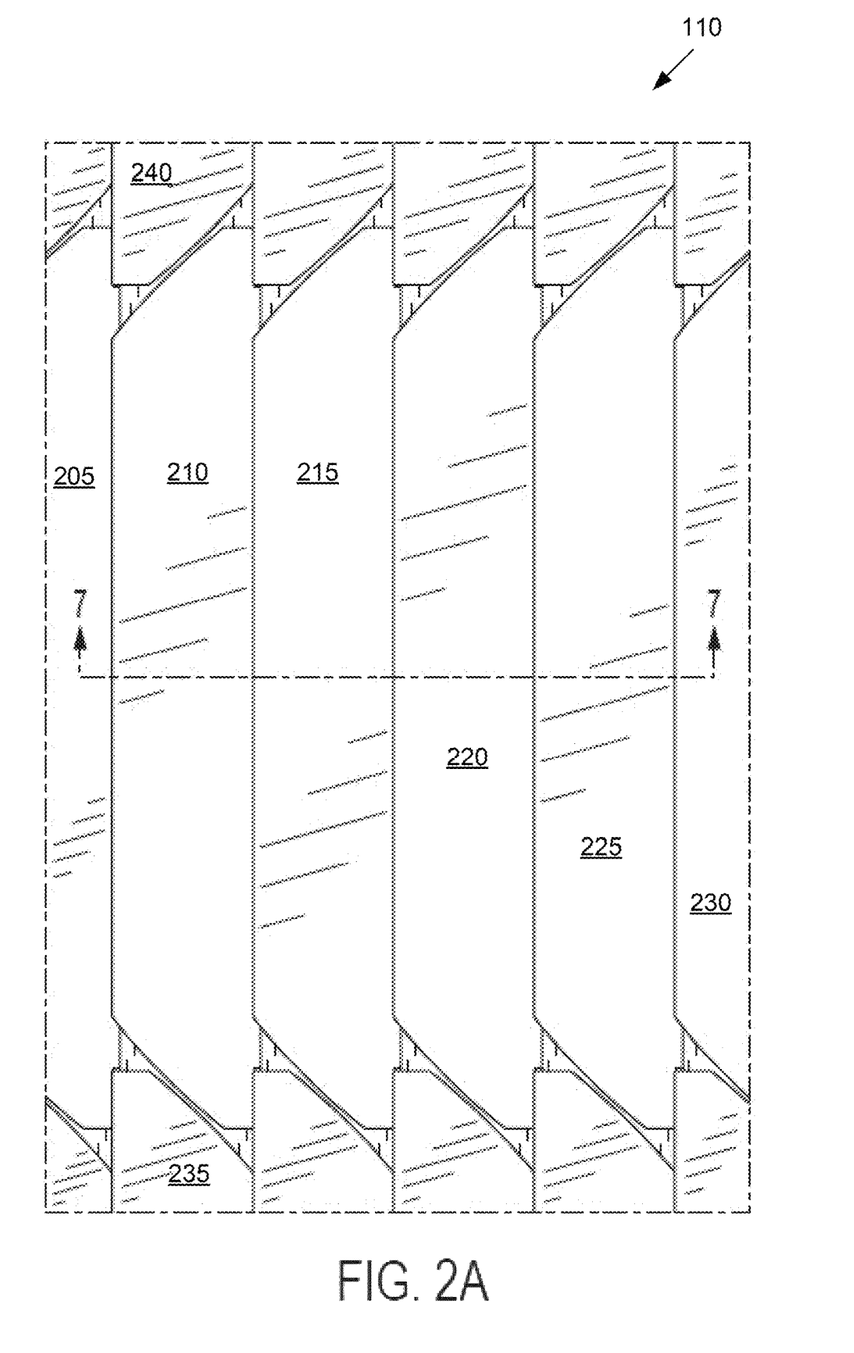
FIG. 2A depicts a portion of a solar panel according to one or more aspects of the disclosed subject matter.

A portion 110 of the solar device 100 is identified to be further described in FIG. 2A.

FIG. 2A depicts a portion 110 of the solar device 100 according to one or more aspects of the disclosed subject matter. The portion 110 of the solar device 100 can include solar wafers 205, 210, 215, 220, 225, 230, 235, and 240. Solar wafers 205, 210, 215, 220, 225, and 230 can be part of an "A" string, such that each of the solar wafers 205, 210, 215, 220, 224, and 230 are electrically connected in series. Additionally, solar wafers 235 and 240 can each be part of a "B" string, wherein solar wafers 235 and 240 can overlap with solar wafer 205 in the "A" string. As a result, each horizontally adjacent solar wafer can be electrically connected in parallel.

Figure 2B:
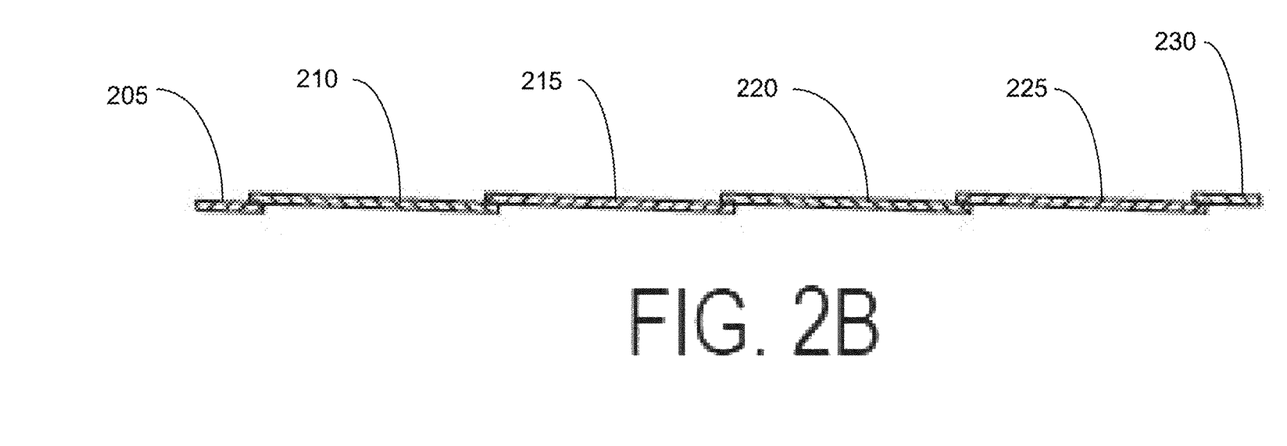
FIG. 2B depicts overlapping solar wafers according to one or more aspects of the disclosed subject matter.

Additionally, a left side elevational view of overlapping solar wafers 205, 210, 215, 220, 225, and 230 are depicted along line 7-7 in FIG. 2B.

FIG. 2B depicts overlapping solar wafers 205, 210, 215, 220, 225, and 230 along line 7-7 according to one or more aspects of the disclosed subject matter. The overlapping solar wafers 205, 210, 215, 220, 225, and 230 can be connected in series.

Figure 3A:
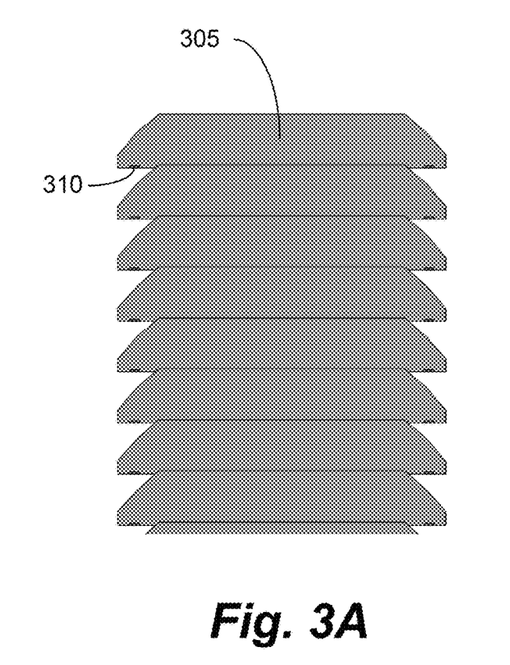
FIG. 3A depicts a back of a first column of solar wafers according to one or more aspects of the disclosed subject matter.

FIG. 3A depicts a front face of a first column (e.g., an "A" string) of solar wafers according to one or more aspects of the disclosed subject matter. The front face of the "A" string can include contact pads 310 for an electrical connection to be established when coupled with another contact pad from another overlapped solar wafer from a "B" string, for example. Additionally, the front face (sun side) of the "A" string can face away from an installation surface, for example. The installation surface can be a roof, for example.

Figure 3B:
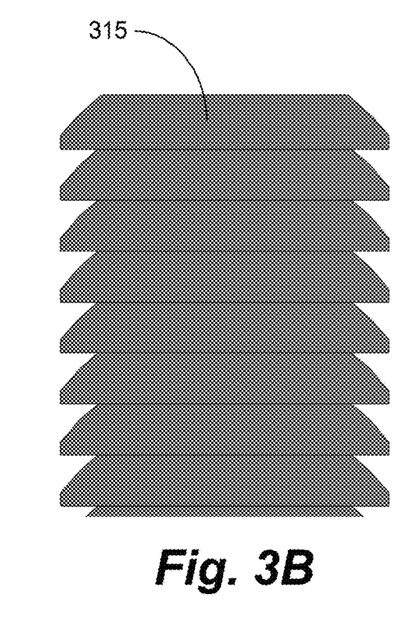
FIG. 3B depicts a front of a first column of solar wafers according to one or more aspects of the disclosed subject matter.

FIG. 3B depicts a back face (shade side) of the first column (e.g., an "A" string) of solar wafers according to one or more aspects of the disclosed subject matter. The back of the "A" string can face toward the installation surface, for example.

Figure 3C:
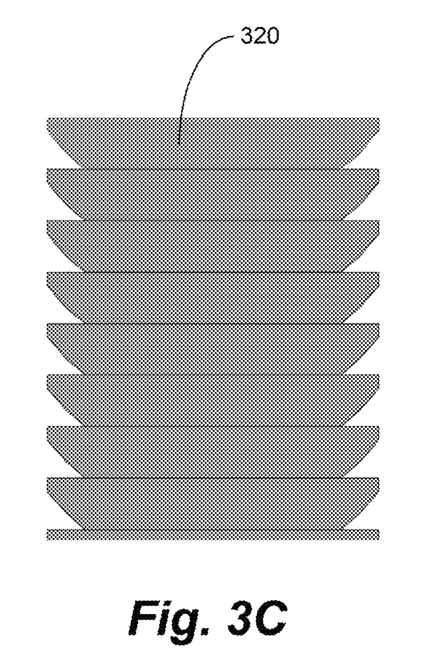
FIG. 3C depicts a back of a second column of solar wafers according to one or more aspects of the disclosed subject matter.

FIG. 3C depicts a front (sun side) of a second column (e.g., a "B" string) of solar wafers according to one or more aspects of the disclosed subject matter. Additionally, the front of the "B" string can face away from the installation surface, for example.

Figure 3D:
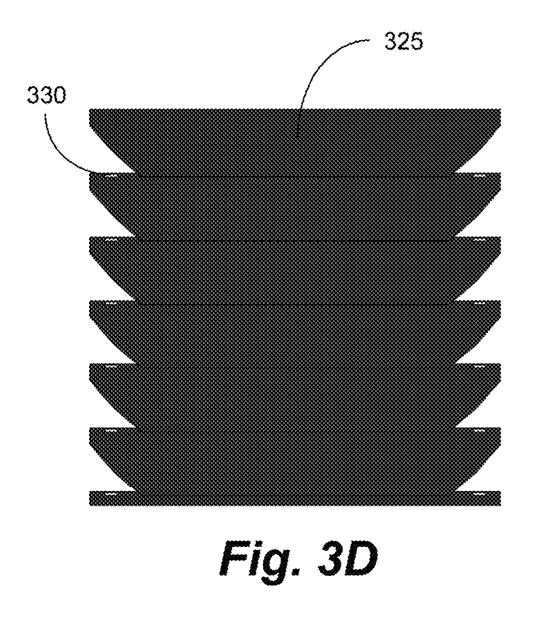
FIG. 3D depicts a front of a first column of solar wafers according to one or more aspects of the disclosed subject matter.

FIG. 3D depicts a back (shade side) of the second column of solar wafers (e.g., a "B" string) according to one or more aspects of the disclosed subject matter. The back of the "B" string can include contact pads 330 that can be coupled to the contact pads 310 on the front of the "A" string, for example. Additionally, the back of the "B" string can face toward the installation surface, for example.

Figure 4:
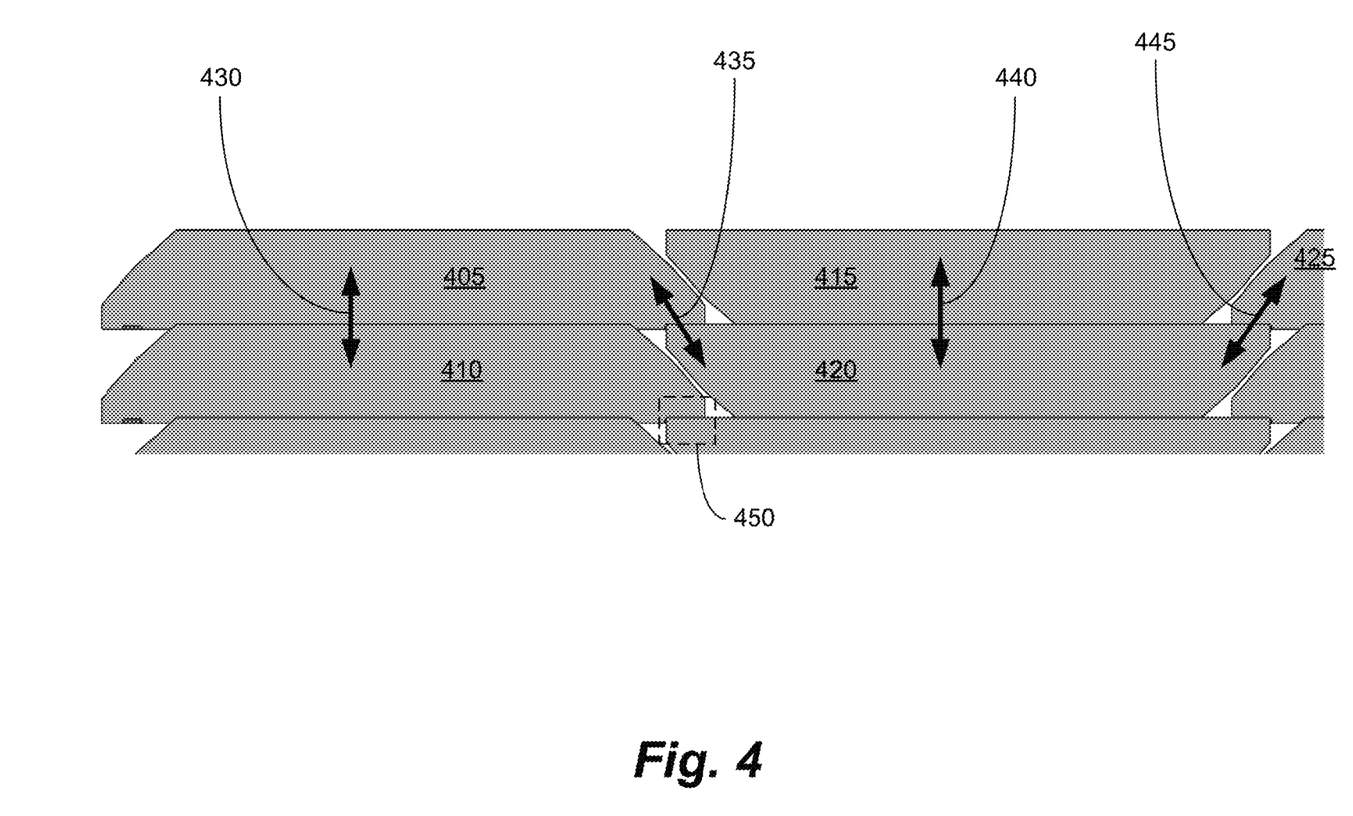
FIG. 4 depicts a close-up elevational view of overlapping solar wafers according to one or more aspects of the disclosed subject matter.

FIG. 4 depicts a close-up elevational view of overlapping solar wafers 405, 410, 415, 420, and 425 according to one or more aspects of the disclosed subject matter. Solar wafers 405, 410, 415, 420, and 425 can represent solar wafers in the solar device 100, for example. Arrows 430, 435, 440, and 445 depict how electrical current can move between the solar wafers. More specifically, arrow 430 can indicate solar wafer 405 being electrically connected to solar wafer 410, wherein solar wafer 405 and solar wafer 410 can be electrically connected in series. Solar wafers 405 and 410 can be part of an "A" string, for example. Similarly, arrow 440 can indicate that solar wafer 415 and solar wafer 420 are electrically connected in series. Solar wafers 415 and 420 can be part of a "B" string, for example. Arrow 435 can indicate that electrical current can travel between solar wafer 405 and solar wafer 420. Similarly, arrow 425 can indicate that electrical current can travel between solar wafer 420 and solar wafer 425. Additionally, arrows 435 and 445 can indicate a solar wafer from a "B" string being connected to two "A" strings. As a result of the electrical connections, horizontally adjacent solar wafers can be electrically connected in parallel.

Additionally, portion 450 can indicate an electrical connection via contact pads 310 (corresponding to a front face of an "A" string solar wafer) and contact pads 330 (corresponding to a back face of a "B" string solar wafer). In other words, portion 450 can indicate that the solar wafers are conductively bonded to each other in the region in which they overlap by an electrically conducting bonding material that electrically connects the metallization pattern of one solar wafer to the metallization pattern of the adjacent solar wafer.

Figure 5:
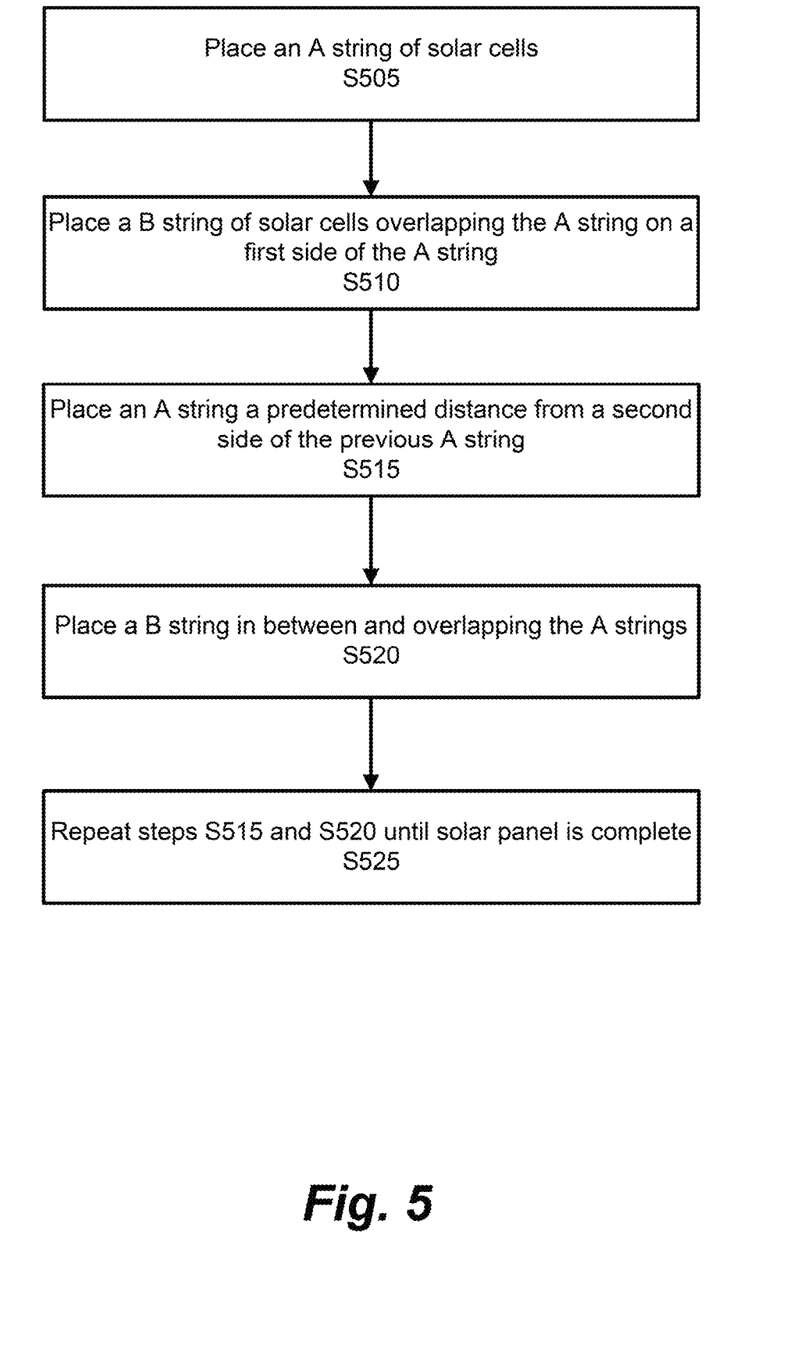
FIG. 5 is an exemplary workflow for layup of a solar device according to one or more aspects of the disclosed subject matter.

FIG. 5 is an exemplary workflow for layup of a solar device according to one or more aspects of the disclosed subject matter. The solar device may be a portion of a solar panel, for example. The layup of the solar device can be separated into "A" and "B" strings, wherein "A" and "B" indicate the order in which the strings are placed. Additionally, an "A" string can include a plurality of solar wafers, wherein each solar wafer is overlapping with one or more vertically adjacent solar wafers. Each solar wafer in each "A" string can have a first predetermined orientation. The layup of each "A" string can include placing a first solar wafer in the first predetermined orientation and placing a subsequent solar wafer overlapping with the first solar wafer (e.g., in a shingling technique). Subsequent solar wafers can be placed overlapping with the previously placed solar wafer until the "A" string is complete. The layup of each "B" string can be analogous to the "A" strings. However, each solar wafer of the "B" string can be placed in a second predetermined orientation, wherein the second predetermined orientation is inverted relative to the first predetermined orientation, for example, as shown in FIGS. 1-4.

In S505, an "A" string of solar wafers can be placed.

In S510, a "B" string of solar wafers can be placed overlapping the "A" string on a first side of the "A" string. The overlapping can be a shingling effect, for example, wherein the overlap occurs on a predetermined portion of each of the "A" string and the "B" string. For example, the predetermined overlap portion can be positioned as further described in portion 450 of FIG. 4. In other words, the "A" string and the "B" string can include contact pads that can facilitate an electrical connection between the solar wafers, and the overlap/shingling of the "A" string and the "B" string can be performed so that the contact pads connect to create the desired electrical connection between solar wafers.

In S515, a subsequent "A" string can be placed a predetermined distance from a second side of the previous "A" string. The second side of the "A" string can be an opposite side of the "A" string relative to the first side of the "A" string. For example, the first side of the "A" string can be a right side of the "A" string, thereby making the second side of the "A" string a left side of the "A" string. In other words, in S510, the "B" string can be placed on a right side of the "A" string. As a result, the subsequent "A" string can be placed a predetermined distance from the left side of the previous "A" string. It should be appreciated the layup could be mirrored (e.g., the first side is the left side and the second side is the right side) to achieve the same end result. The predetermined distance can be a distance in which a "B" string can be placed in between the two most recently placed "A" strings while still overlapping each of the two most recently placed "A" strings such that the contact pads of each solar wafer are aligned and sufficiently connected to provide an electrical connection.

In S520, a "B" string can be placed in between and overlapping the two most recently placed "A" strings such that the overlapping allows corresponding contact pads to sufficiently connect to provide an electrical connection.

In S525, steps S515 and S520 can be repeated until the layup of the solar device (e.g., solar device 100) is complete. To describe the layup in other words, it could be considered that the columns of solar wafers in FIG. 1 can be numbered from one through five from left to right where one, three, and five are "A" strings and two and four are "B" strings. The order of the layup can occur by placing column five, then column three (leaving space for column four as described in S515), then column four (which is placed overlapping both column three and column five as described in S520), then column one (leaving space for column two as described in S515), then column two (which is placed overlapping both column one and column three as described in S520). It should be appreciated that the strings can be placed in an order that results in "B" strings overlapping one or more "A" strings. For example, the order of the layup can be placing all "A" strings first, and "B" strings can be placed overlapping "A" strings.

It should be appreciated that an adhesive can be added on each "A" string before placing the "B" strings to provide additional robustness to the connection of the contact pads (e.g., as in portion 450 described in FIG. 4).

The solar device (e.g., solar device 100) includes several advantages including that each horizontal row of strips is connected in parallel. As a result, each strip provides multiple alternative current paths which make it more resistant to shading, cracking in the strips, and degradation of single strips. Additionally, the parallel connections provide multiple current paths for the current to flow instead of having to force its way through a damaged strip, for example.

The parallel connections also allow each individual strip to operate at its optimal current. This is beneficial because individual strips have slightly different optimal operating currents, and normally incur slight power loss due to this 'performance mismatch' between strips in series. Without the parallel connections, each strip is forced to produce the same current as the string that it is in series with. The parallel connections reduce or eliminate the 'performance mismatch' power loss.

Further, the parallel connections can provide a reduced product size for the same amount of power, and redundant parallel connections provide advantages for reliability, as well as reduce the quantity of diodes needed in the design.

Also, if diodes are employed, the multiple parallel connections can eliminate the need to attach an additional conductor for the diode connection to the strips. In an example, an electrical conductor can be attached to the rear of a row of strips to make them electrically parallel. The diode can then be electrically connected to the parallel connection. If the strips are already electrically connected in parallel, the additional conductor can be omitted.

The solar wafer modules may be advantageously employed under "one sun" (non-concentrating) illumination, and may have physical dimensions and electrical specifications allowing them to be substituted for conventional silicon solar wafer modules.

The use of discrete front surface contact pads can reduce the amount of silver on the solar wafer, which may advantageously reduce cost.

Additionally, both higher voltages and increased partitioning create potential advantages for power optimization.

Further, it may be advantageous that solar wafers electrically connected in parallel can produce snatching or approximately matching voltages under the same illumination.

As indicated above, particular embodiments may employ shingling of chamfered cut wafers. In such cases, there can be a heat spreading advantage to mirror, along the bond line between each wafer with the adjacent wafer.

Solar wafers having long and narrow aspect ratios and areas less than that of a standard solar wafer (e.g., 156 mm×156 mm) may be advantageously employed to reduce $I^2R$ resistive power losses in solar wafer modules, for example. In particular, the reduced area of solar wafers compared to standard size silicon solar wafers can decrease the current produced in the solar wafer, directly reducing resistive power loss in the solar wafer.

A significant advantage of shingling for high-voltage solar modules is heat spreading between solar wafers in a shingled system. For example, heat may be readily transported along a silicon super wafer through thin electrically and thermally conductive bonds between adjacent overlapping silicon solar wafers. A thin bond between shingled solar wafers can reduce resistive loss at the interconnection between wafers, and also promotes flow of heat along the connected solar wafers from any hot spot in the solar wafers that might develop during operation.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The invention claimed is:
1. A solar device, comprising:
a first string of first solar cells, wherein a plurality of the first solar cells each overlap with, and are conductively bonded to, at least one vertically adjacent solar cell from the first string; and
a second string of second solar cells, wherein a plurality of the second solar cells each overlap with, and are conductively bonded to, at least one vertically adjacent solar cell from the second string,
wherein, for a plurality of the first solar cells, the first solar cell overlaps with one of the plurality of second solar cells in a region and the first solar cell is electrically connected to the one of the plurality of second solar cells in the region of overlap such that the first cell is connected to horizontally adjacent solar cells in parallel.

2. The solar device of claim 1, wherein contact pads disposed on a front face of the plurality of the first solar cells are conductively bonded to contact pads disposed on a rear face of the plurality of the second solar cells to electrically connect the horizontally adjacent solar cells in parallel when the plurality of the first solar cells overlap with the plurality of the second solar cells.

3. The solar device of claim 1, wherein the plurality of the first solar cells are electrically connected in series.

4. The solar device of claim 1, wherein the plurality of the second solar cells are electrically connected in series.

5. The solar device of claim 1, wherein each of the first solar cells and the second solar cells includes chamfered edges on a first side of the solar cell and contact pads on a second side of the solar cell, wherein the second side of the solar cell is opposite the first side of the solar cell.

6. The solar device of claim 5, wherein the plurality of the first solar cells in each first string have a first predetermined orientation.

7. The solar device of claim 6, wherein the plurality of the second solar cells in each second string have a second predetermined orientation, wherein the second predetermined orientation is inverted relative to the first predetermined orientation.

8. The solar device of claim 1, wherein the overlap is further configured to increase active area of the solar device.

9. A solar device, comprising:
a first string of first solar cells having a first orientation, wherein a plurality of the first solar cells overlap with, and are conductively bonded to, at least one vertically adjacent solar cell from the first string;
a second string of second solar cells having the first orientation, wherein the second string is positioned a predetermined distance from the first string; and
a third string of third solar cells having a second orientation, wherein the third string is positioned in between the first string of first solar cells having the first orientation and the second string of second solar cells having the first orientation,
wherein, for each third solar cell of a plurality of the third solar cells, the third solar cell overlaps with a first solar cell of the plurality of the first solar cells in a first overlap region and overlaps with a second solar cell of the second string of second solar cells in a second overlap region and the third solar cell is electrically connected to the first solar cell in the first region and to the second solar cell in the second region such that the third solar cell is connected to horizontally adjacent solar cells from the first string and the second string.

10. The solar device of claim 9, wherein the first string of first solar cells is electrically connected in series.

11. The solar device of claim 9, wherein the second string of second solar cells is electrically connected in series.

12. The solar device of claim 9, wherein the third string of third solar cells is electrically connected in series.

13. The solar device of claim 9, wherein the second orientation is inverted relative to the first orientation.

14. The solar device of claim 9, wherein the plurality of the first solar cells overlap with one or more of the plurality of third solar cells to electrically connect horizontally adjacent solar cells in parallel.

15. The solar device of claim 9, wherein the plurality of second solar cells overlap with one or more of the plurality of third solar cells to electrically connect horizontally adjacent solar cells in parallel.

16. The solar device of claim 9, wherein a plurality of horizontally adjacent solar cells from each of the first string, second string, and third string are electrically connected in parallel.

17. The solar device of claim 16, wherein each first solar cell, second solar cell, and third solar cell includes contact pads configured to electrically connect the plurality of horizontally adjacent solar cells in parallel when each first string of solar cells is overlapping with one or more second strings of solar cells.

18. The solar device of claim 17, wherein each first solar cell, second solar cell, and third solar cell includes chamfered edges on a first end and the contact pads on a second end, wherein the second end is opposite the first end.

19. The solar device of claim 9, wherein the plurality of the first solar cells overlapping with one or more of the plurality of the third solar cells and the plurality of second solar cells overlapping with one or more of the plurality of the third solar cells are configured to increase active area of the solar device.

20. A method of solar device layup, comprising:
placing a first string of first solar cells having a first orientation such that a plurality of the first solar cells each overlap with, and are conductively bonded to, at least one vertically adjacent solar cell from the first string;
placing a second string of second solar cells having the first orientation such that the second string is positioned a predetermined distance from the first string;
placing a third string of third solar cells having a second orientation such that the third string is positioned in between the first string of first solar cells having the first orientation and the second string of second solar cells having the first orientation,
wherein, for each third solar cell of a plurality of the third solar cells, the third solar cell overlaps with a first solar cell of the plurality of the first solar cells in a first overlap region and overlaps with a second solar cell of the second string of second solar cells in a second overlap region and the third solar cell is electrically connected to the first solar cell in the first region and to the second solar cell in the second region such that the third solar cell is connected to horizontally adjacent solar cells from the first string and the second string.

\* \* \* \* \*